(12) United States Patent
Beyerle

(10) Patent No.: US 8,069,197 B2
(45) Date of Patent: Nov. 29, 2011

(54) METHOD AND APPARATUS FOR PERIODIC NOISE SUPPRESSION IN TRANSIENT SIGNALS

(75) Inventor: Albert G. Beyerle, Santa Barbara, CA (US)

(73) Assignee: Mirmar Sensor, L.L.C., Goleta, CA (US)

( * ) Notice: Subject to any disclaimer, the term of this patent is extended or adjusted under 35 U.S.C. 154(b) by 1048 days.

(21) Appl. No.: 11/941,000

(22) Filed: Nov. 15, 2007

(65) Prior Publication Data

US 2008/0136517 A1    Jun. 12, 2008

Related U.S. Application Data

(60) Provisional application No. 60/866,036, filed on Nov. 15, 2006.

(51) Int. Cl.
*G06F 17/10* (2006.01)
(52) U.S. Cl. ...................................................... 708/300
(58) Field of Classification Search ........................ None
See application file for complete search history.

(56) References Cited

U.S. PATENT DOCUMENTS

| | | | | |
|---|---|---|---|---|
| 5,029,118 A * | 7/1991 | Nakajima et al. | ............. | 702/195 |
| 5,278,777 A * | 1/1994 | Cummins | ..................... | 702/195 |
| 5,884,234 A * | 3/1999 | Jorion et al. | ..................... | 702/66 |
| 5,966,684 A * | 10/1999 | Richardson et al. | .......... | 702/191 |
| 6,026,135 A * | 2/2000 | McFee et al. | ................. | 376/159 |
| 6,766,854 B2 * | 7/2004 | Ciglenec et al. | ......... | 166/250.11 |

* cited by examiner

*Primary Examiner* — David H Malzahn
(74) *Attorney, Agent, or Firm* — Felix L. Fischer

(57) ABSTRACT

A system for cyclical noise removal from a transient signal is employed with a transient sensor for a signal. A signal conditioner is connected to the transient sensor for processing the signal. A transient digitizer captures the processed signal including capture of a sufficient period of time before the transient to accurately analyze the cyclic noise, capture of a period of time to be sure the transient is not effecting the ambient and capture of the period of the transient. A signal processor is employed for filtering of a non-cyclic transient signal. An embedded computer with associated software performs an analysis of the ambient background just prior to the time that the transient signal of interest is detected, performs an analysis of the signal of interest, extends the analyzed ambient background signal through the period of time during which the transient signal is occurring and subtracts the background from the transient signal.

10 Claims, 4 Drawing Sheets

METHOD AND APPARATUS FOR PERIODIC NOISE SUPPRESSION IN TRANSIENT SIGNALS

REFERENCE TO RELATED APPLICATIONS

This application claims the benefit of U.S. provisional application Ser. No. 60/866,036 filed on Nov. 15, 2006 having the same title as the present application, the disclosure of which is incorporated herein by reference as though fully set forth.

FIELD OF THE INVENTION

This invention relates generally to signal processing and more particularly to a method and apparatus for removal of periodic background noise from a non-repetitive transient signal.

RELATED ART

A common type of electronic sensor processing involves deriving useful information from a transient noncyclical signal. An example of such a signal is the output from a nuclear radiation detector, where the sensor produces a signal in response to an event, but the events are independent of each other and not cyclical in nature. Information is to be extracted from the signal by execution of a variety of numerical algorithms. In the example of a nuclear radiation detector, the sensor output pulse is often analyzed to yield the energy of the radiation.

Characteristic of non-cyclical transient signals, the useful information contained in the signal occurs over some limited period of time and is not repeated. This period of time, defines a bandwidth of the signal, or a range of frequencies which must be examined by the pulse processing electronics. Standard filtering techniques exist to eliminate noise which is distinguished from the signal by its bandwidth.

It is therefore desirable to provide a system which filters periodic noise in the background which may have significantly the same bandwidth as the transient signal of interest.

SUMMARY OF THE INVENTION

The innovation is a technique to remove periodic background noise from a non-repetitive transient signal thereby increasing the signal-to-noise ratio of the transient signal. An exemplary system for cyclical noise removal from a transient signal incorporates a transient sensor for a signal. A signal conditioner is connected to the transient sensor for processing the signal. A transient digitizer captures the processed signal and a signal processor is employed for filtering of a non-cyclic transient signal. An embedded computer with associated software performs an analysis of the ambient background just prior to the time that the transient signal of interest is detected, performs an analysis of the signal of interest, extends the analyzed ambient background signal through the period of time during which the transient signal is occurring and subtracts the background from the transient signal.

In an exemplary embodiment, the capturing digitizer captures a sufficient period of time before the transient to accurately analyze the cyclic noise, captures a period of time to be sure the transient is not effecting the ambient and captures the period of the transient.

DESCRIPTION OF THE DRAWINGS

These and other features and advantages of the present invention will be better understood by reference to the following detailed description when considered in connection with the accompanying drawings wherein.

DETAILED DESCRIPTION

The technique described here is intended to remove periodic noise that occurs within the frequency band of interest. The character of this cyclical noise is that it has a repetitive pattern which changes slowly compared to the bandwidth of interest for the signal, but its detailed structure may or may not be in the same frequency range as the signal. Examples of such noise may be radio interference caused by a nearby transmitter, electrical noise on the power supply lines, or microphonic noise from mechanical vibration. Traditional design calls for careful isolation of such sources of noise, a practice which is recommended even with this innovation. An example of this is shown in FIG. 1 where the transient signal is shown with 6 and without 8 the noise.

This innovation is to characterize the cyclical background noise, extrapolate its nature in the time frame of the sensor signal, and to remove the noise from the signal of interest. It relies on the assumption that the overall character of the repetitive background signal is changing in a different time frame than the transient signal of interest.

It is a standard technique that characterizing a signal over a time period much longer than the inverse of the bandwidth produces an accurate representation of the cyclical repetitive signal and eliminates the non-repetitive component. The innovation described here is to utilize these standard techniques to characterize the ambient background, and then subtract the cyclical portion of the background that is within the bandwidth of the transient signal. A digital signal processing system would perform an analysis of the ambient background just prior to the time that the transient signal of interest is detected. In an exemplary embodiment this is a Fourier analysis. When the signal of interest is detected, it would also be similarly analyzed. The background would then be subtracted from the transient signal, probably but not necessarily in the frequency domain, and the signal would then probably but not necessarily be transformed back to the spatial domain, depending on the needs of the future analysis.

Figure 1:
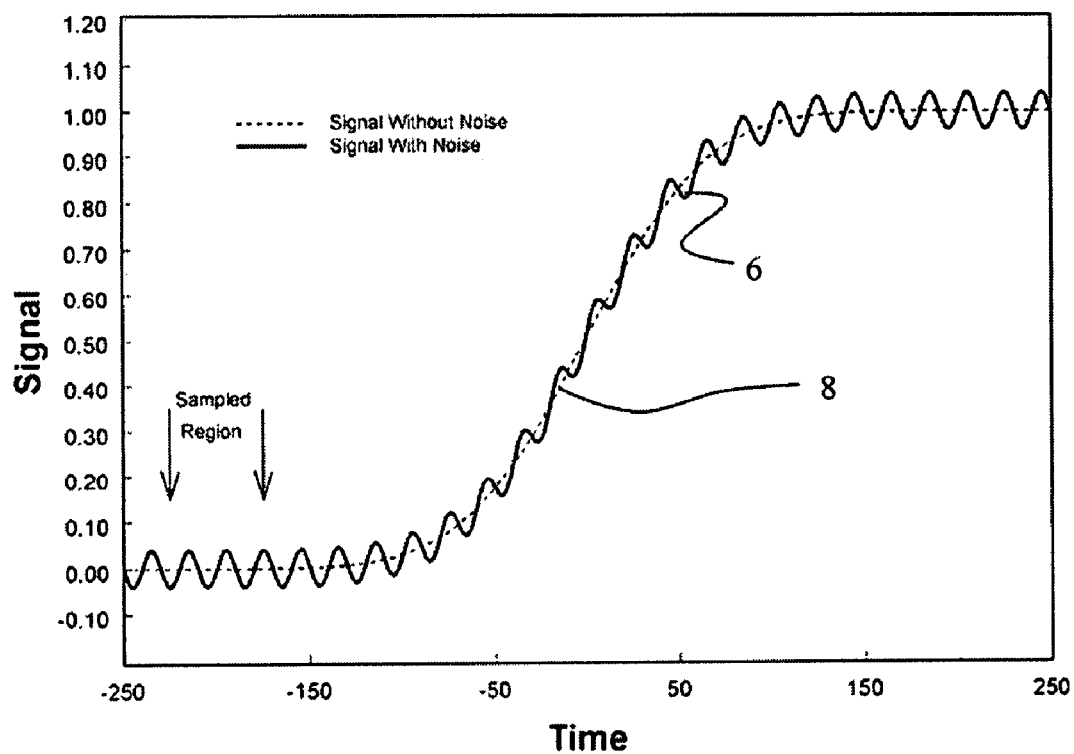
FIG. 1 is an exemplary transient signal shown with and without noise.

A waveform from a sensor as shown in FIG. 1 is continuously digitized with sufficient accuracy for whatever digital processing needs to occur for the target analysis of the transient. Some sensors may have signals which are not transient, but the target signal in this innovation is a transient signal from the sensor. When a transient waveform 24 of interest from the sensor is recognized, the waveform is captured in a digital memory. The captured waveform must contain an ambient signal 26 covering a sufficient period of time 28 before the transient to accurately analyze the cyclic noise. This is generally several periods of the lowest frequency cyclic noise of interest in the waveform. Generally some period of time 30 must be left between the ambient and the transient to be sure the transient is not effecting the ambient. The captured waveform must also extend through the period of the transient 32 so as to fully contain the transient waveform 24 to be analyzed.

The captured ambient background signal 26 is then extended through the period of time during which the transient signal 24 is occurring. Techniques to extend the transient are well known in the art. Chief among them are Fourier transform analysis although other transforms or time-domain analysis may also be used. Once the transient is extended, it is subtracted digitally from the captured waveform.

The altered captured waveform is then passed to whatever analysis is to be accomplished. The transient analysis can then be performed in the same manner as before alteration of the captured waveform, except that the cyclic component of the noise will have been removed.

Figure 2:
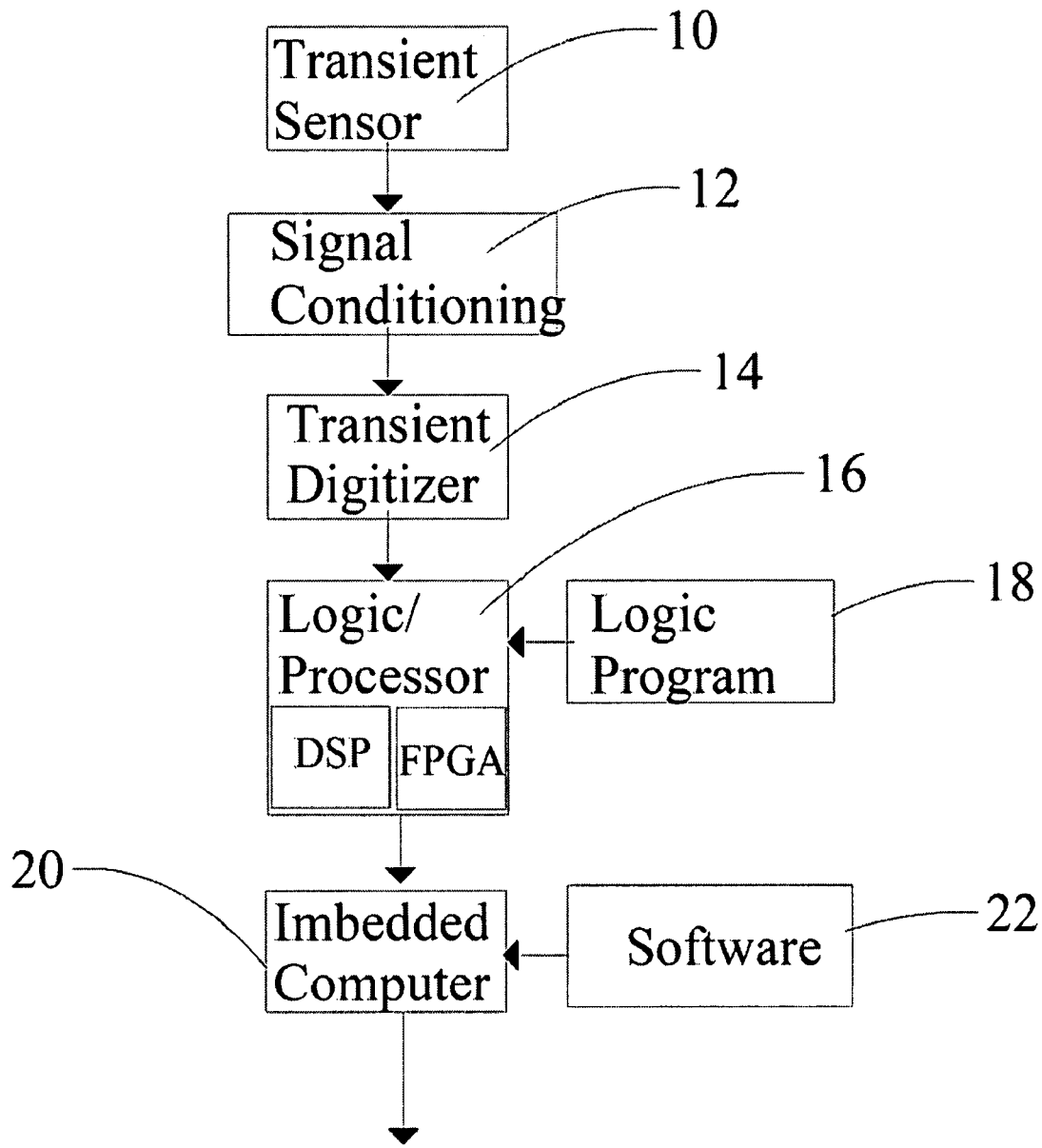
FIG. 2 is a block diagram of the apparatus elements employed in the invention.
Figure 3:
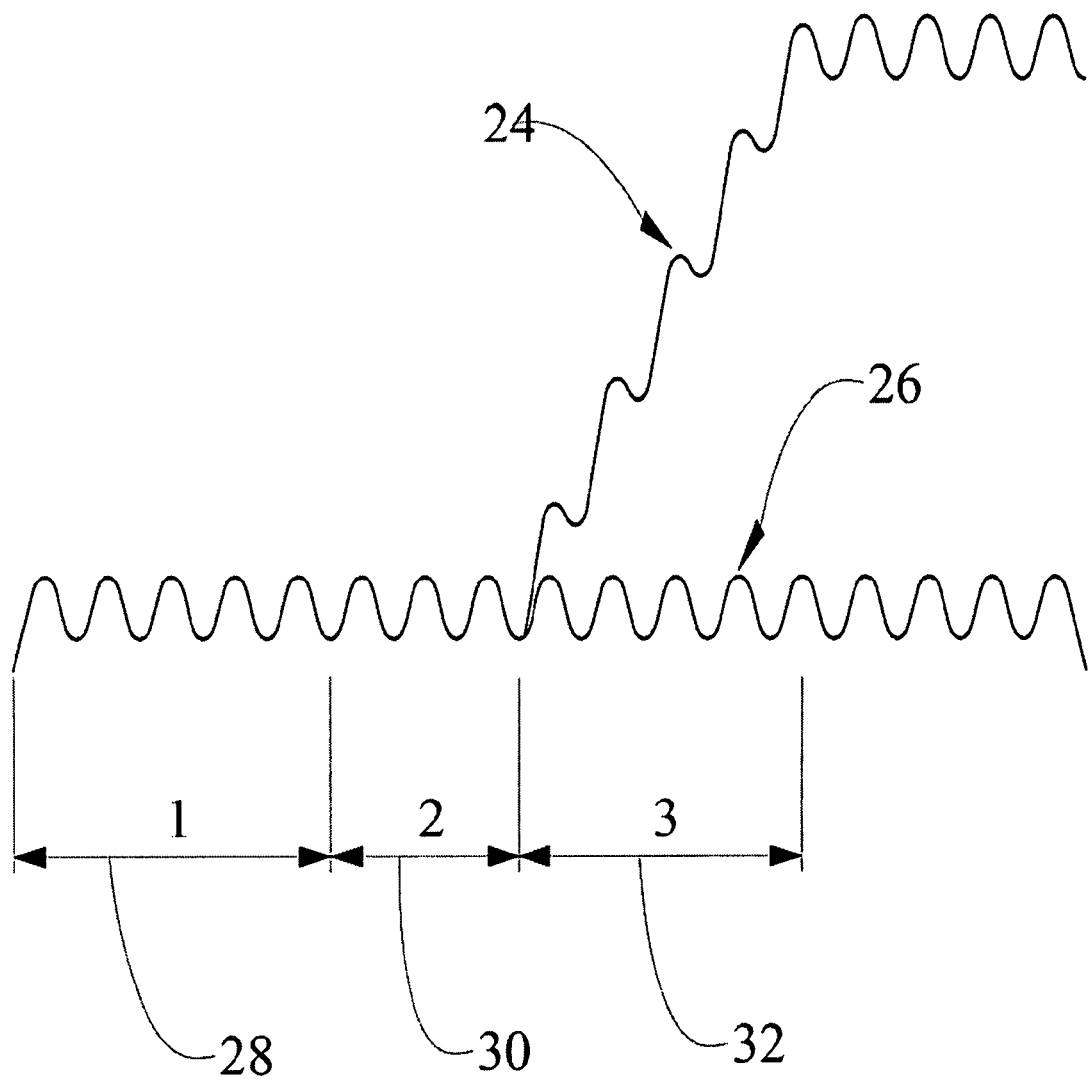
FIG. 3 is an exemplary signal plot showing the periods of signal collection for the noise and transient for analysis; and, FIG. 4 is a flow chart of the method steps of the invention.

The implementation of this technique could utilize a programmable logic device and/or a specialized Digital Signal Processor. One embodiment of hardware for the technique is shown in FIG. 2. In this scheme, the input signal is received by a transient sensor 10 such as a nuclear spectroscopy sensor. Signal conditioning 12 is accomplished and the transient is digitized using a transient digitizer 14 which for exemplary embodiments is a standard Analog to Digital Converter. The signal processing is then done by a combination field programmable gate array (FPGA) and digital signal processing (DSP) system 16. The DSP performs the digitization, and filtering of a non-cyclic transient signal from the nuclear spectroscopy sensor under the control of a logic program 18. An embedded computer 20 with associated software 22 is employed for conducting the analysis required as disclosed above. The technique described above could be added to the filter function of existing electronics in a nuclear radiation detector with firmware changes.

Figure 4:
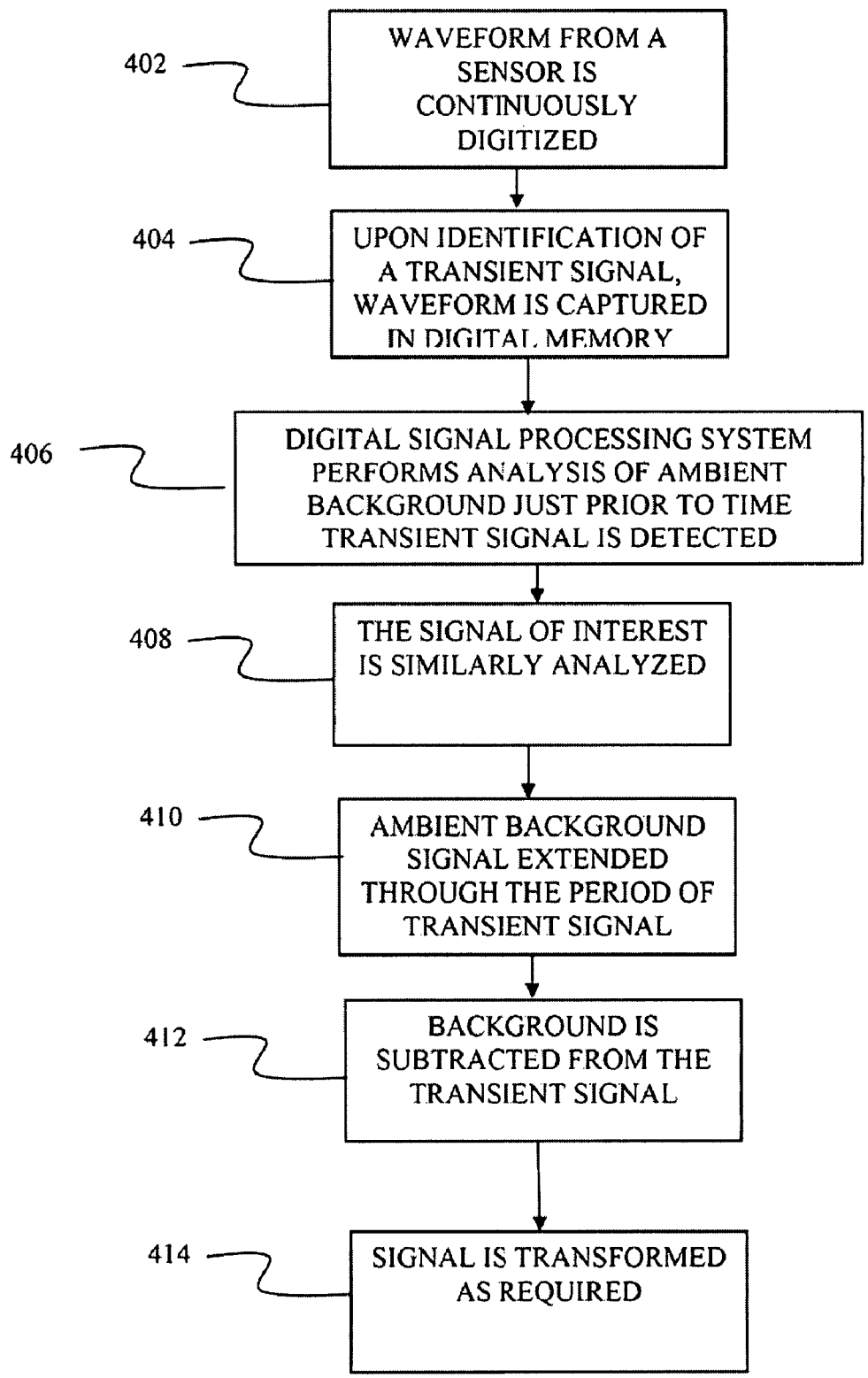

FIG. 4 shows a flow chart of the overall process for the system. A waveform from a sensor is continuously digitized 402. Upon identification of a transient signal, the waveform is captured in a digital memory 404 with a sufficient period of time before the transient to accurately analyze the cyclic noise, generally several periods of the lowest frequency cyclic noise, a period of time to be sure the transient is not effecting the ambient and the period of the transient. A digital signal processing system performs an analysis of the ambient background just prior to the time that the transient signal of interest is detected 406. The signal of interest is similarly analyzed 408. The analyzed ambient background signal is then extended through the period of time during which the transient signal is occurring 410. The background is then subtracted from the transient signal 412 and the signal is transformed as required 414 depending on the needs of the future analysis.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A system for cyclical noise removal from a transient signal comprising:
   a transient sensor for a signal;
   a signal conditioner connected to the transient sensor and processing the signal;
   a transient digitizer receiving the processed signal;
   a signal processor for filtering of a non-cyclic transient waveform;
   an embedded computer with associated software for
   performing an analysis of the ambient background just prior to the time that the transient waveform of interest is detected;
   performing an analysis of the signal containing the transient waveform of interest;
   extending the analyzed ambient background through the period of time during which the transient waveform is occurring; and,
   subtracting the background from the transient waveform.

2. A system as defined in claim 1 wherein the transient sensor is a nuclear spectroscopy sensor.

3. A system as defined in claim 1 wherein the transient digitizer is a standard Analog to Digital Converter.

4. A system as defined in claim 1 wherein the signal processor is a combination field programmable gate array (FPGA) and digital signal processing (DSP) system.

5. A method for noise removal from a transient signal comprising the steps of:
   digitizing a signal from a sensor;
   identifying a transient waveform;
   capturing the transient waveform in a digital memory;
   performing an analysis of ambient background in the signal just prior to the time that the transient waveform of interest is detected;
   performing an analysis of the transient waveform of interest;
   extending the analyzed ambient background through the period of time during which the transient waveform is occurring; and,
   subtracting the extended ambient background from the transient waveform.

6. The method of claim 5 wherein the step of capturing the transient waveform in a digital memory further includes the steps of:
   capturing a sufficient period of time before the transient to accurately analyze the cyclic noise;
   capturing a period of time to be sure the transient waveform is not effecting the ambient background; and
   capturing the period of the transient waveform.

7. The method of claim 5 wherein the step of performing an analysis of the ambient background includes the steps of:
   transforming the ambient background to the frequency domain and
   conducting a Fourier analysis of the transformed ambient background.

8. The method of claim 5 wherein the step of performing an analysis of the transient waveform of interest includes the steps of:
   transforming the transient waveform of interest to the frequency domain and
   conducting a Fourier analysis of the transient waveform.

9. The method of claim 5 further including the step of transforming a resulting transient signal from the subtraction of the ambient background from the transient waveform for further processing.

10. The method of claim 9 wherein the step of transforming comprises transforming the transient signal back to the spatial domain.

* * * * *